(12) United States Patent
Liao et al.

(10) Patent No.: US 10,665,545 B2
(45) Date of Patent: May 26, 2020

(54) SEMICONDUCTOR DEVICES, SEMICONDUCTOR PACKAGES AND METHODS OF FORMING THE SAME

(71) Applicant: Taiwan Semiconductor Manufacturing Co., Ltd., Hsinchu (TW)

(72) Inventors: Sih-Hao Liao, New Taipei (TW); Hung-Jui Kuo, Hsinchu (TW); Yu-Hsiang Hu, Hsinchu (TW); Meng-Che Tu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 49 days.

(21) Appl. No.: 16/134,963

(22) Filed: Sep. 19, 2018

(65) Prior Publication Data
US 2020/0091073 A1    Mar. 19, 2020

(51) Int. Cl.
| H01L 21/00 | (2006.01) |
| H01L 23/532 | (2006.01) |
| H01L 23/522 | (2006.01) |
| H01L 25/065 | (2006.01) |
| H01L 23/00 | (2006.01) |
| H01L 21/768 | (2006.01) |
| H01L 21/02 | (2006.01) |
| C08L 33/08 | (2006.01) |
| C08L 79/08 | (2006.01) |
| C08L 65/00 | (2006.01) |

(Continued)

(52) U.S. Cl.
CPC ............ *H01L 23/5329* (2013.01); *C08K 5/42* (2013.01); *C08L 33/08* (2013.01); *C08L 65/00* (2013.01); *C08L 79/08* (2013.01); *H01L 21/02118* (2013.01); *H01L 21/76801* (2013.01); *H01L 23/3171* (2013.01); *H01L 23/5226* (2013.01); *H01L 23/53228* (2013.01); *H01L 24/11* (2013.01); *H01L 24/17* (2013.01); *H01L 25/0655* (2013.01); *H01L 2224/024* (2013.01); *H01L 2224/0231* (2013.01); *H01L 2224/02379* (2013.01)

(58) Field of Classification Search
CPC . H01L 23/5329; H01L 21/02118; C08L 79/08
See application file for complete search history.

(56) References Cited

U.S. PATENT DOCUMENTS

| 7,719,000 B2 * | 5/2010 | Jeong | ..................... C09K 11/06 |
| | | | 257/40 |
| 8,758,880 B2 * | 6/2014 | Flores | .................. C08G 61/123 |
| | | | 257/40 |

(Continued)

FOREIGN PATENT DOCUMENTS

| EP | 0133533 A2 * | 2/1985 | ......... H01L 23/3171 |
| WO | WO-2017033833 A1 * | 3/2017 | ......... H01L 23/5329 |

*Primary Examiner* — Laura M Menz
(74) *Attorney, Agent, or Firm* — JCIPRNET

(57) ABSTRACT

Semiconductor devices, semiconductor packages and methods of forming the same are provided. One of the semiconductor device includes a dielectric layer and a connector. The dielectric layer includes a dielectric material and an additive, wherein the additive includes a compound represented by Chemical Formula 1. The connector is disposed in the dielectric layer.

20 Claims, 9 Drawing Sheets

(51) Int. Cl.
   *C08K 5/42*   (2006.01)
   *H01L 23/31*  (2006.01)

(56) References Cited

U.S. PATENT DOCUMENTS

| | | |
|---|---|---|
| 8,841,411 B2 * | 9/2014 | Kawano ................ C08G 61/02 |
| | | 313/504 |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,240,551 B2 * | 1/2016 | Hayoz ................. C08G 61/124 |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,505,877 B2 * | 11/2016 | Welker ................. C07D 417/14 |
| 10,403,822 B2 * | 9/2019 | McCulloch ......... H01L 51/0036 |
| 2012/0189782 A1 * | 7/2012 | Zafiropoulos ........... C08L 79/08 |
| | | 427/535 |
| 2014/0357898 A1 * | 12/2014 | Kawano ................ C08G 61/02 |
| | | 568/326 |
| 2019/0256659 A1 * | 8/2019 | Kalinina ............ C08G 73/0672 |

* cited by examiner

SEMICONDUCTOR DEVICES, SEMICONDUCTOR PACKAGES AND METHODS OF FORMING THE SAME

BACKGROUND

Developments of the three-dimensional integration technology for wafer level packaging are underway to satisfy the demands of size reduction, high performance interconnects and heterogeneous integration for high-density integration packages. However, there are many challenges related to the semiconductor package such as solder residue and delamination of the dielectric layer from the connector.

BRIEF DESCRIPTION OF THE DRAWINGS

Aspects of the present disclosure are best understood from the following detailed description when read with the accompanying FIGURES. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
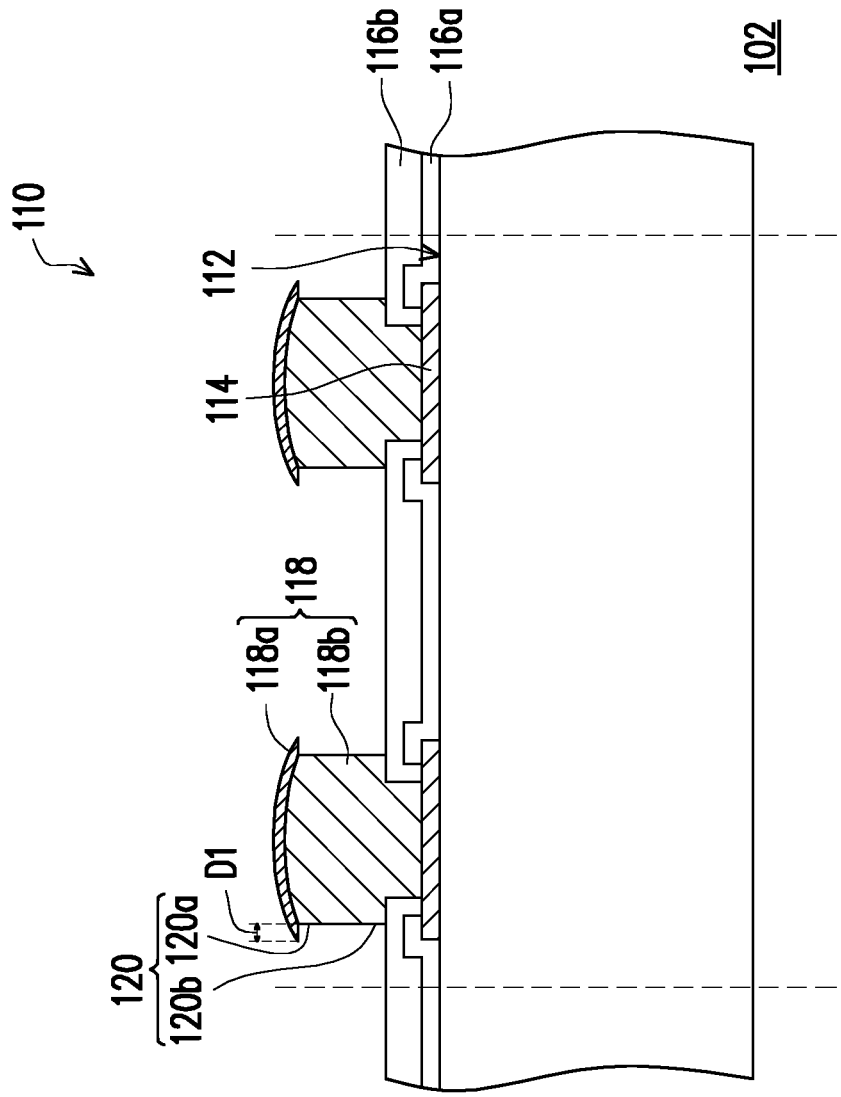
FIG. 1A through FIG. 1I are schematic cross sectional views of various stages in a method of forming a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGURES. The spatially relative terms are intended to encompass different orientations of the device in use or operation in addition to the orientation depicted in the FIGURES. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the FIGURES, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1I are schematic cross sectional views of various stages in a method of forming a semiconductor package in accordance with some embodiments. In exemplary embodiments, the semiconductor manufacturing method is part of a packaging process. In some embodiments, two chips or dies are shown to represent plural chips or dies of the wafer.

Referring to FIG. 1A, in some embodiments, a first die 110 having a connector 118 thereon is provided. In some embodiments, a wafer 102 including a plurality of first dies 110 is provided, and the wafer 102 has a frontside and a backside. In some embodiments, as shown in FIG. 1A, the dotted line represents the cutting line of the package in the subsequent cutting process. In some embodiments, the first die 110 may be a memory chip, a logic chip, a digital chip, an analog chip or a mixed signal chip, such as an application processor chip, a system on chip (SoC), an application-specific integrated circuit ("ASIC") chip, a high bandwidth memory (HBM) chip, a sensor chip, a wireless and radio frequency (RF) chip, a voltage regulator chip or any other suitable chip. In some embodiments, the first die 110 includes an active surface 112, a plurality of pads 114 distributed on the active surface 112, at least one passivation layer 116a, 116b covering the active surface 112 and a plurality of connectors 118 over the passivation layer 116a, 116b. The pads 114 are electrically connected to underlying conductive patterns (not shown). In some embodiments, the pads 114 are aluminum pads, for example. The passivation layer 116a, 116b covers and partially exposes the pads 114. In some embodiments, the passivation layer 1116b is disposed on the passivation layer 116a, for example. In some alternative embodiments, one of the passivation layers 116a, 116b may be omitted. In some embodiments, a material of the passivation layers 116a, 116b includes polyimide such as high-temperature cured polyimide, benzocyclobutene ("BCB"), polybenzoxazole ("PBO"), or any other suitable polymer-based dielectric material.

In some embodiments, the connectors 118 are disposed on the passivation layer 116a, 116b and electrically connect to the pads 114 through the openings of the passivation layer 116a, 116b. In some embodiments, the connector 118 includes a conductive pillar 118a and a solder layer 118b on the conductive pillar 118a. In some embodiments, the conductive pillar 118a includes a sidewall 120 including an upper portion 120a and lower portion 120b, and the upper portion 120a and the lower portion 120b of the sidewall 120 are substantially aligned. In some embodiments, a thickness of the connector 118 ranges from 20 µm to 25 µm, and a thickness of the solder layer 118b ranges from 1 µm to 2 µm, for example. In some embodiments, a material of the conductive pillar 118a includes copper (Cu), and a material of the solder layer 118b includes tin (Sn), for example. In some embodiments, the solder layer 118b is formed on the conductive pillar 118a, and an intermetallic compound (IMC, not shown) such as $Cu_3Sn$ and $Cu_6Sn_5$ is formed at an interface between the solder layer 118b and the conductive pillar 118a during a reflow process. In some embodiments, the solder layer 118b is substantially not flowing down onto the sidewall 120 of the conductive pillar 118a. In other words, before forming a dielectric layer 122 (shown in FIG. 1B) over the connector 118, the solder layer 118b covers a top surface of the conductive pillar 118a, and the sidewall 120 of the conductive pillar 118a is substantially exposed. In addition, although the solder layer 118b is substantially not flowing down onto the sidewall 120 of the conductive pillar 118a, the solder layer 118b is extended beyond the conductive pillar 118a, and a horizontal distance D1 between an edge of the solder layer 118b and an edge of the conductive pillar 118a ranges from 0.5 μm to 2 μm, for example. In some embodiments, a top surface of the connector 118 is convex, for example. In some alternative embodiments, the top surface of the connector 118 may be planar or concave.

Figure 1B:
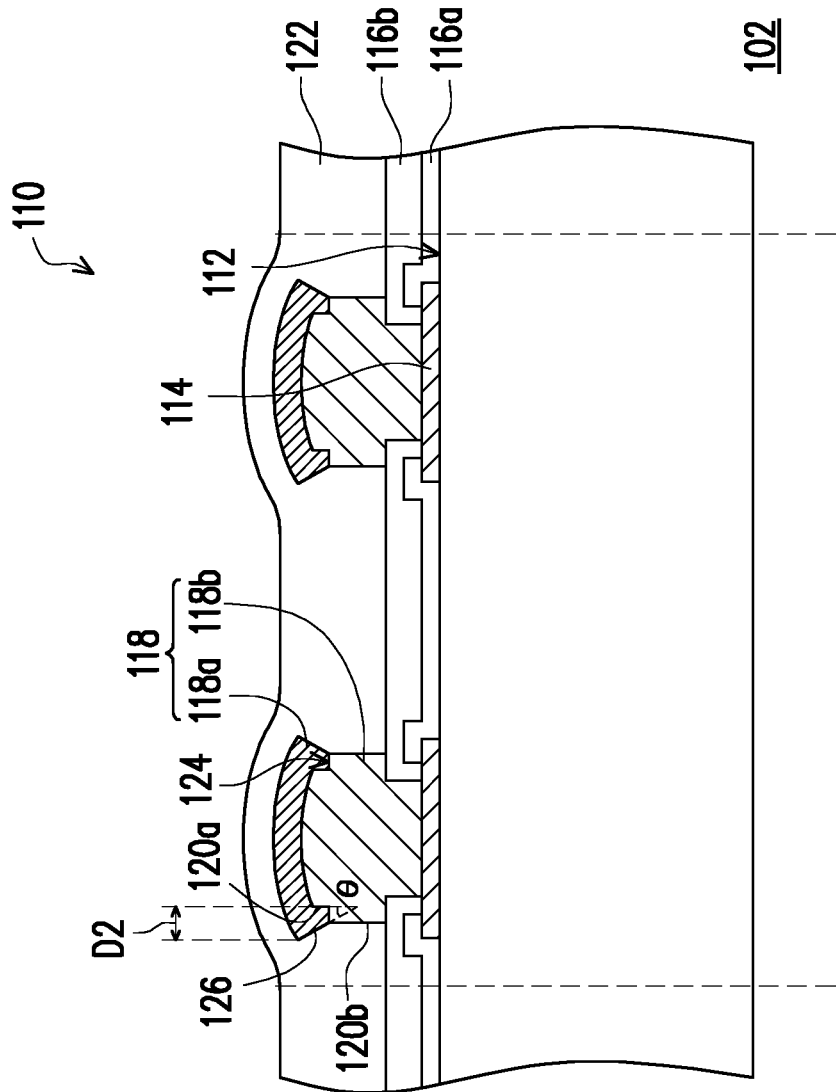

Referring to FIG. 1B, a dielectric layer 122 is formed over the first die 110 to cover the connector 118 and the passivation layer 116b. In some embodiments, the dielectric layer 122 may include a dielectric material and an additive. The additive may function as an adhesion promotor which accelerates the adhesion of the dielectric material to the connector 118 and the passivation layer 116b. In some embodiments, the dielectric material is photosensitive or non-photosensitive. In some embodiments, the dielectric material is a photosensitive material such as a positive type-photosensitive material or a negative type-photosensitive material, and the additive may be also a photo-active compound. In some embodiments, the additive includes a compound represented by the following Chemical Formula 1:

[Chemical Formula 1]

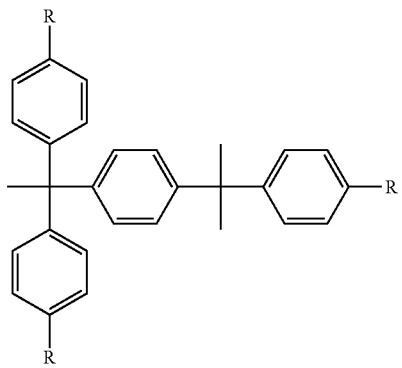

in Chemical Formula 1,

R is hydrogen, a hydroxyl group, a halogen group, a C1-C6 alkyl group, a carboxyl group, a vinyl group, an allyl group, a phenyl group, —OR', —COR", —CONR", —COOR", —CH$_2$—CR"C=CR"$_2$ or —SiR"$_3$, wherein R' is a C1-C6 alkyl group or a group represented by the following Chemical Formula 2 or the following Chemical Formula 3:

[Chemical Formula 2]

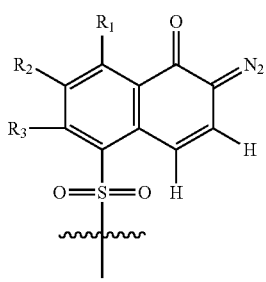

[Chemical Formula 3]

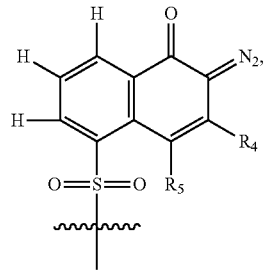

in Chemical Formula 2,

R$_2$ and R$_3$ are hydrogen, and R$_1$ is hydrogen, a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C=CR"$_2$, —SiR"$_3$,

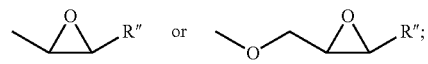

or

R$_1$ and R$_2$ are hydrogen, and R$_3$ is a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C=CR"$_2$ or —SiR"$_3$;

in Chemical Formula 3, one of R$_4$ and R$_5$ is hydrogen, and the other of R$_4$ and R$_5$ is hydrogen, a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C=CR"$_2$ or —SiR"$_3$; and R" is a halogen group, a C1-C6 alkyl group, a vinyl group, an allyl group or a phenyl group.

In some embodiments, the alkyl group may be straight-chained. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, and the like, but are not limited thereto. In some embodiments, examples of a halogen group include fluorine, chlorine, bromine or iodine.

In some embodiments, the dielectric material a negative type-photosensitive material, and the additive includes an aromatic compound containing a sulfonyl group or a sulfonate group. In some embodiments, the sulfonate group may be expressed as —SO$_3$X, and X may be hydrogen, an element of Group 1 or aromatic group. Examples of the aromatic compound includes sodium 1,2-naphthoquinone-diazide-5-sulfonate (CAS No. 2657-00-3), 2,3,4-trihydroxy-benzophenone tris(1,2-naphthoquinone diazide-5-sulfonate) (CAS No. 5610-94-6), 2,3,4-trihydroxybenzophenone 1,2-naphthoquinone diazide-5-sulfonate (CAS No. 68510-93-0) and the like. In some embodiments, the sulfonyl group may be expressed as —SO$_2$X, and X may be a halogen group such as chlorine. An example of the sulfonate group includes —SO$_2$Cl, and examples of the additive include 1,2-naphthoquinone-2-diazido-5-sulfonyl chloride (CAS No. 3770-97-6) and the like. In some embodiments, the additive includes diazonaphthoquinone sulfonic acid derivatives such as 2-diazo-1-oxo-1,2-dihydronaphthalene-5-sulfonic acid (CAS No. 20546-03-6), 2-diazo-1-naphthol-5-sulfonic acid (CAS No. 23890-27-9), sodium 1,2-Naphthoquinone-2-diazido-5-sulfonate (CAS No. 2657-00-3), 2-diazo-1,2-naphthoquinone-4-sulfonic acid (CAS No. 20680-48-2), 2-diazo-1-naphthol-4-sulfonic acid (CAS No. 16926-71-9), 3-Diazonio-4-hydroxy-1-naphthalenesulfonic acid (CAS No. 16926-71-9)1,2-naphthoquinone-2-diazido-4-sulfonate (CAS No. 64173-96-2), 1-diazo-1,2-naphthoquinone-5-sulfonic acid (CAS No. 4857-48-1), 1-diazo-1,2-naphthoquinone-4-sulfonic acid (CAS No. 4857-47-0), 1-diazo-2-naphthol-4-sulfonic acid (CAS No. 20541-54-2), 2-diazo-1,2-naphthoquinone-6-sulfonic acid (CAS No. 124529-10-8), 2-diazo-1,2-naphthoquinone-5-sulfonyl chloride (CAS No. 3770-97-6), 2-diazo-1,2-naphthoquinone-4-sulfonyl chloride (CAS No. 36451-09-9), 1-diazo-1,2-naphthoquinone-5-sulfonyl chloride (CAS No. 20584-13-8), 1-diazo-1,2-naphthoquinone-4-sulfonyl chloride (CAS No. 38626-82-3), 1-diazo-1,2-naphthoquinone-6-sulfonyl chloride (CAS No. 103452-31-9), 4-(tert-butyl)phenyl 2-diazo-1-oxo-1,2-dihydronaphthalene-5-sulfonate (CAS No. 31600-99-4), 1-naphthalenesulfonic acid, 6-di azo-5,6-dihydro-5-oxo-4-(1-methyl-1-phenylethyl)phenyl ester (CAS No. 71728-47-7), 1-naphthalenesulfonic acid, 6-diazo-5,6-dihydro-5-oxo ester with 4,4',4"-methylidynetris (CAS No. 138636-86-9), 1-naphthalenesulfonic acid, 6-diazo-5,6-dihydro-5-oxo ester with 2,2' thiobis[1-naphthalenol] (CAS No. 118276-85-0), 1-naphthalenesulfonic acid, 6-diazo-5,6-dihydro-5-oxo-,2-(2-methoxyethyl)ethyl ester (CAS No. 71550-36-2), 1-naphthalenesulfonic acid, 6-diazo-5,6-dihydro-5-oxo-,thiodi-1,2-naphthalenediyl ester (CAS No. 68901-25-7), 1-naphthalenesulfonic acid, 6-diazo-5,6-dihydro-5-oxo-, thiodi-4,1-phenylene ester (CAS No. 68901-24-6), 1-naphthalenesulfonic acid, 6-diazo-5,6-dihydro-5-oxo-,2,3-dibromopropyl ester (CAS No. 42372-37-2), 1-naphthalenesulfonic acid, 6-diazo-5,6-dihydro-5-oxo-,2-methoxyethyl ester (CAS No. 42372-33-8), 1-naphthalenesulfonic acid, 6-diazo-5,6-dihydro-5-oxo-, methylenedi-1,2-naphthalenediyl ester (CAS No. 33910-44-0), 1-naphthalenesulfonic acid, 6-diazo-5,6-dihydro-5-oxo-, phenyl ester (CAS No. 23295-00-3), 1-naphthalenesulfonic acid, 6-diazo-5,6-dihydro-5-oxo-, ester with (2,4-dihydroxyphenyl) (2,3,4-trihydroxyphenyl)methanone (CAS No. 124364-82-5), 1-naphthalenesulfonicacid,6-diazo-5,6-dihydro-5-oxo-,4-benzoyl-1,2,3-benzenetriylester (CAS No. 5610-94-6), 1-naphthalenesulfonic acid, 6-diazo-5,6-dihydro-5-oxo-, ester with phenyl(2,3,4-trihydroxyphenyl)methanone (CAS No. 68510-93-0), 4-benzoyl-2,3-dihydroxyphenyl 6-diazo-5,6-dihydro-5-oxonaphthalene-1-sulphonate (CAS No. 2481-86-9), 3-benzoyl-2,6-dihydroxyphenyl 6-diazo-5,6-dihydro-5-oxonaphthalene-1-sulphonate (CAS No. 75578-78-8), 6-benzoyl-2,3-dihydroxyphenyl 6-diazo-5,6-dihydro-5-oxonaphthalene-1-sulphonate (CAS No. 75578-79-9), 4-benzoyl-3-hydroxy-1,2-phenylene bis(6-diazo-5,6-dihydro-5-oxonaphthalene-1-sulphonate) (CAS No. 32060-64-3), 3-benzoyl-6-hydroxy-1,2-phenylene bis(6-diazo-5,6-dihydro-5-oxonaphthalene-1-sulphonate) (CAS No. 75578-77-7), 1-naphthalenesulfonic acid, 6-diazo-5,6-dihydro-5-oxo-,4-benzoyl-1,3-phenylene ester (CAS No. 31001-73-7), (CAS No. 62655-78-1), formaldehyde polymer with 3-methylphenol, 6-diazo-5,6-dihydro-5-oxo-1-naphthalenesulfonate (CAS No. 68584-99-6), 1-naphthalenesulfonic acid, 6-diazo-5,6-dihydro-5-oxo-, ester with bis(2,4-dihydroxyphenyl)methanone (CAS No. 123759-89-7), 1-naphthalenesulfonicacid, 6-diazo-5,6-dihydro-5-oxo-, 4-benzoyl-2-hydroxy-1,3-phenylene ester (CAS No. 93965-14-1), 1-Naphthalenesulfonicacid, 6-diazo-5,6-dihydro-5-oxo-, 4-[1-(4-hydroxyphenyl)-1-methylethyl]phenylester (CAS No. 53155-39-8), 1-naphthalenesulfonicacid, 3-diazo-3,4-dihydro-4-oxo-, 1,1',1"-(4-benzoyl-1,2,3-benzenetriyl) ester (CAS No. 84522-08-7), 1-naphthalenesulfonic acid, 3-diazo-3,4-dihydro-4-oxo-, ar'-(1-methylethyl)(1,1'-biphenyl)-4-yl ester (CAS No. 52125-43-6), formaldehyde, polymer with 3-methylphenol, 3-diazo-3,4-dihydro-4-oxo-1-naphthalenesulfonate (CAS No. 129290-81-9), 1-naphthalenesulfonic acid, 3-diazo-3,4-dihydro-4-oxo-, ester with bis(2,4-dihydroxyphenyl)methanone (CAS No. 132176-10-4), 1-naphthalenesulfonic acid, 3-diazo-3,4-dihydro-4-oxo-, ester with phenyl (2,3,4-trihydroxyphenyl)methanone (CAS No. 125857-81-0), 1-naphthalenesulfonic acid, 3-diazo-3,4-dihydro-4-oxo-, ester with (4-hydroxyphenyl)(2,3,4-trihydroxyphenyl) (CAS No. 124760-77-6) and 1-naphthalenesulfonic acid, 3-diazo-3,4-dihydro-4-oxo-,4-(1,1-dimethylethyl)phenyl ester (CAS No. 58886-62-7) and the like.

In some embodiments, the dielectric material may be polyimide such as low-temperature cured polyimide or high-temperature cured polyimide, PBO or polyacrylate, for example. In an embodiment, the dielectric material may be polyimide. In some embodiments, the dielectric layer 122 may be formed by initially generating the dielectric material composition, which may include the dielectric material along with the additive placed into a solvent. In some embodiments, the dielectric material composition has low coefficient of thermal expansion (CTE) ranging from 35-45, for example. In some embodiments, the solvent may be an organic solvent, and may be tetrahydrofuran (THF), ethyl lactate, ethyl ethoxypropionate, n-methylpyrrolidone (NMP), N, N-dimethylformamide (DMF) or γ-butyrolactone (GBL), for example.

In some embodiments, the dielectric material, the additive and any other chosen additives or other agents, are added to the solvent for application. For example, the dielectric material may have a concentration of between about 20% and about 40%, such as between about 25 wt % and about 35 wt %, while the additive may have a concentration of between about 0.5 wt % and about 5 wt %. The solvent may have an amount of between about 30% and about 60%, for example. Once added, the mixture is then mixed in order to achieve an even composition in order to ensure that there are no defects caused by an uneven mixing or non-constant composition. Once mixed together, the dielectric material composition may either be stored prior to its usage or else used immediately.

Once ready, the dielectric layer 122 may be utilized by initially applying the dielectric material composition onto the connector 118 and the passivation layer 116b. The dielectric layer 122 may be applied to the connector 118 and the passivation layer 116b so that the dielectric layer 122 coats an upper exposed surface and a sidewall exposed surface of the connector 118, and may be applied using a process such as a spin-on coating process, a dip coating method, an air-knife coating method, a curtain coating method, a wire-bar coating method, a gravure coating method, a lamination method, an extrusion coating method, combinations of these, or the like. The dielectric layer 122 may be placed to a thickness of between about 15 μm to about 30 μm.

After applying, the dielectric layer 122 may be cured. In an embodiment in which the dielectric layer 122 includes polyimide, the curing process may be performed at a temperature of between about 170° C. and 320° C. for a time of between about 1 hour and about 2 hours. In particular embodiments the curing process may be performed at a temperature of about 320° C. for about 1.5 hours. However, any suitable temperature and time may be utilized.

In some embodiments, during the curing process of forming the dielectric layer 122, the solder layer 118b may be react with the top portion of the conductive pillar 118a, so as to form the IMC. Therefore, as shown in FIG. 1B, it seems that a depression 124 is formed at an edge of the conductive pillar 118a, and the solder layer 118b is disposed is extended into and filled in the depression 124 to cover the upper portion 120a of the sidewall 120 of the conductive pillar 118a. In some embodiments, the upper portion 120a and the lower portion 120b of the sidewall 120 are not aligned, and the lower portion 120b is outside the upper portion 120a. In some embodiments, a horizontal distance D2 between the lower portion 120b and the upper portion 120a of the sidewall 120 ranges from 0.5 μm to 2 μm, for example. In some embodiments, an included angle θ formed between an extended line of a sidewall 126 of the solder layer 118b and an extended line of the upper portion 120a of the sidewall 120 of the conductive pillar 118a is about 30 degrees to 45 degrees, for example. In some embodiments, a thickness of the solder layer 118b ranges from 5 μm to 9 μm, for example.

Conventionally, during the curing process, since the interface bonding between the dielectric layer and the IMC is weak, the IMC may be flowing down to the sidewall of the conductive pillar. The IMC on the sidewall of the conductive pillar is called as a solder residue, and the solder residue has to be additionally removed by a removal process such as an etching process. In addition, the delamination or the peeling is easily found at the interface between the solder residue and the dielectric layer. On contrary, in some embodiments, since the dielectric layer 122 includes the additive, the interface bonding strength between the dielectric layer 122 and the IMC is significantly improved. Therefore, the IMC flowing is inhibited, and the solder residue is prevented to be formed. Accordingly, the delamination or the peeling is avoided. For example, compared to a length of the solder residue of about 10 μm and an interface peeling strength less than 600 Wm conventionally, a length of the solder residue may be reduced to 2 μm or less and an interface peeling strength may be larger than 700 N/m in some embodiments. Therefore, an impact on the electrical connection due to the solder residue is prevented.

Figure 1C:
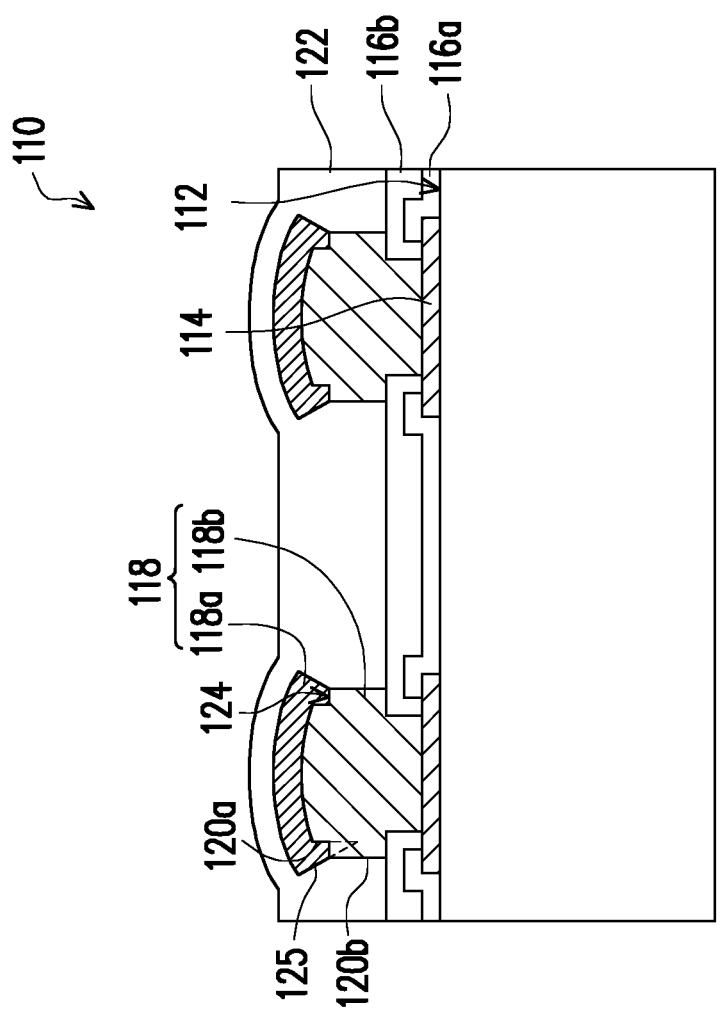

Referring to FIG. 1C, in some embodiments, before mounting on a carrier C (shown in FIG. 1D), a thinning process such as a grinding process or an etching process is performed on the backside of the wafer 102 to reduce a thickness of the first die 110. Then, a dicing process or singulation process may be performed on the wafer 102 along the cutting line to form the first die 110.

Figure 1D:
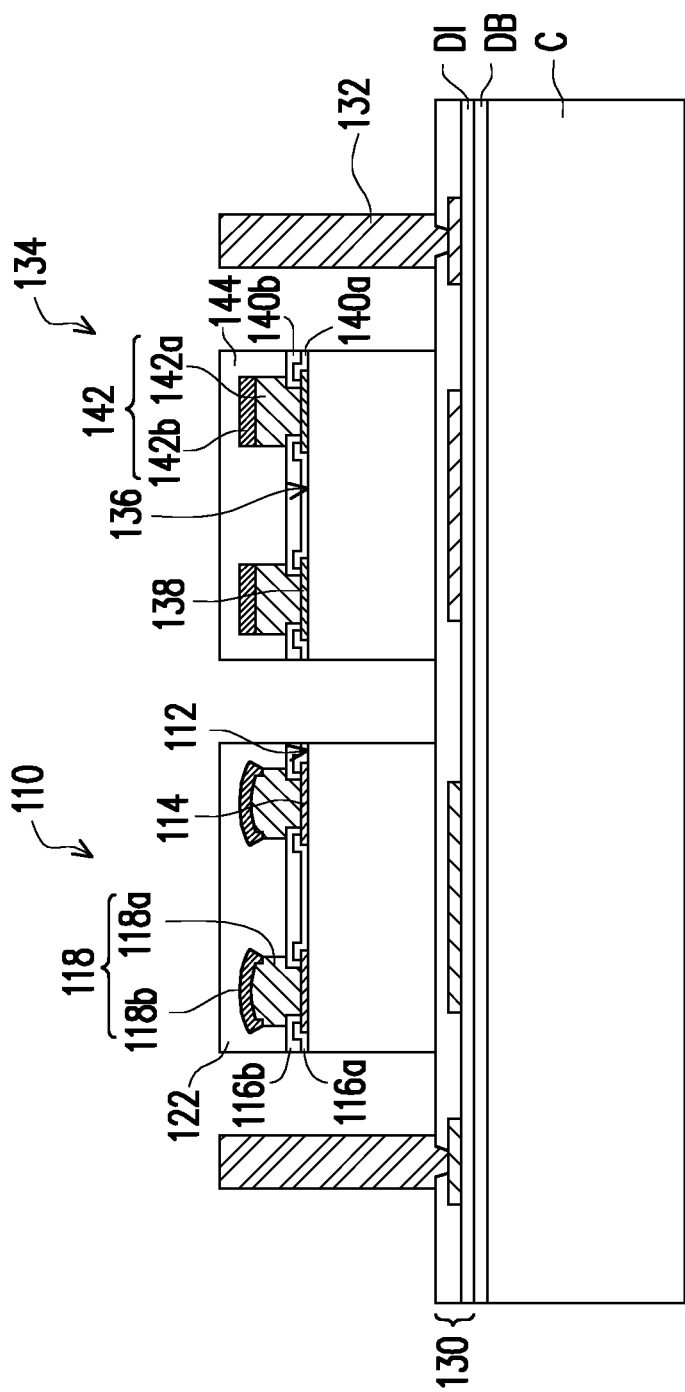

Referring to FIG. 1D, the carrier C is provided with a de-bonding layer DB and a dielectric layer DI coated thereon, and the de-bonding layer DB is between the carrier C and the dielectric layer DI. In some embodiments, the carrier C may be a glass carrier or any suitable carrier for carrying a semiconductor wafer or a reconstituted wafer for the manufacturing method of the semiconductor package. In some embodiments, a material of the de-bonding layer DB may be any material suitable for bonding and debonding the carrier C from the above layers or wafer disposed thereon. In some embodiments, the de-bonding layer DB includes, for example, a light-to-heat conversion ("LTHC") layer, and such layer enables room temperature debonding from the carrier C by applying laser irradiation. In some embodiments, the dielectric layer DI includes a dielectric material including BCB, PBO, or any other suitable polymer-based dielectric material. In some embodiments, a redistribution layer 130 is formed on a first side of the carrier C. The formation of the redistribution layer 130 includes sequentially forming one or more dielectric material layers and one or more metallization layers in alternation. In some embodiments, a material of the dielectric material layer may be the same as or different from the material of the dielectric layer 122. In other words, in an embodiment, the dielectric material layer may be formed of the dielectric material and the additive. In some embodiments, a plurality of through integrated fan-out ("InFO") vias (TIVs) 132 are formed on and electrically connected to the redistribution layer 130 over the carrier C. In some embodiments, the redistribution layer 130 is a backside redistribution layer electrically connected to the TIVs 132, for example.

Then, the first die 110 and at least one second die 134 are placed on the carrier C. In some embodiments, the second die 134 is disposed aside the first die 110. The second die 134 and the first die 110 may be of the same or different type. The second die 134 may have the same or different components as the first die 110, for example. In some embodiments, the second die 134 includes an active surface 136, a plurality of pads 138 distributed on the active surface 136, at least one passivation layer 140 covering the active surface 136, a plurality of connectors 142 over the passivation layer 140 and a dielectric layer 144 covering the connectors 142. The connector 142 may include a conductive pillar 142a and a solder layer 142b on the conductive pillar 142a. The materials and the configuration of the connector 142 and the dielectric layer 144 may be the same as or different from those of the connector 118 and the dielectric layer 144. In some embodiments, the second die 134 is a memory chip such as a dynamic random access memory (DRAM) or any other suitable chip. In some embodiments, a die attach film (not shown) may be further formed on the first die 110 and the second die 134 for better attachment, and the backsides of the first die 110 and the second die 134 are adhered to the carrier C.

Figure 1E:
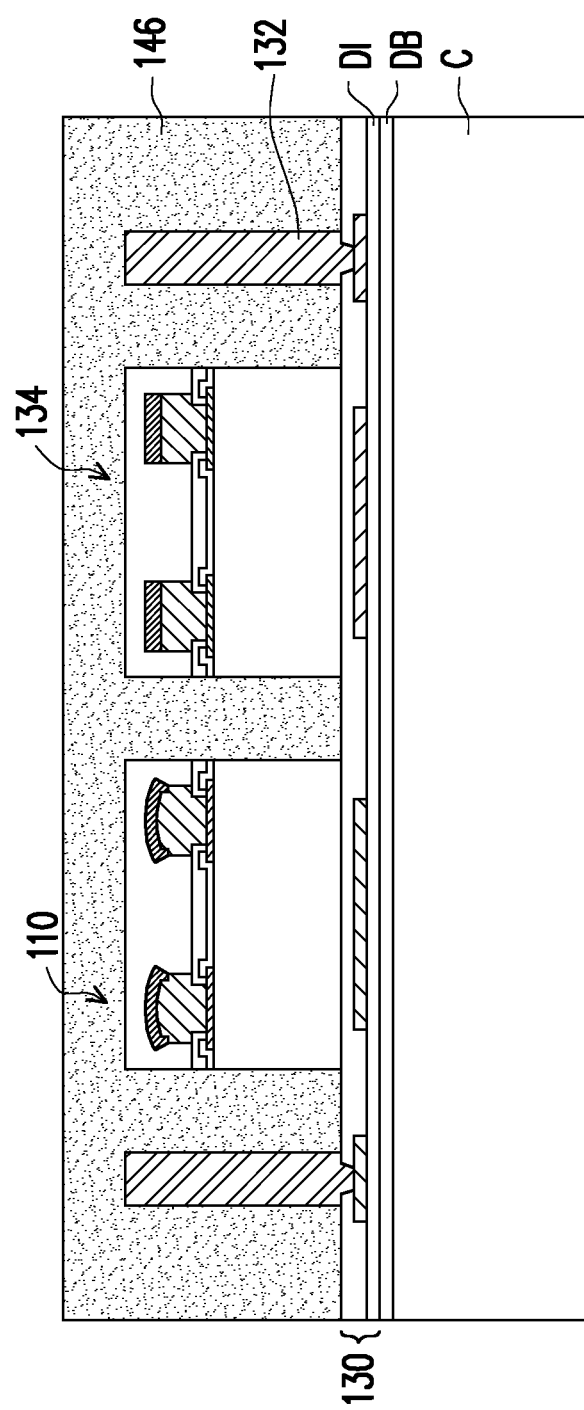

Referring to FIG. 1E, an encapsulating material 146 is formed over the carrier C, and the first die 110 and the second die 134 on the de-bonding layer DB and the TIVs 132 located over the carrier C beside the first die 110 and the second die 134 are molded in the encapsulating material 146. In some embodiments, the encapsulating material 146 covers the tops of the first die 110, the second die 134 and the TIVs 132, and fills between two of the first die 110, the second die 134 and the TIVs 132. A material of the encapsulating material 146 may include a molding compound such as epoxy or other suitable materials.

Figure 1F:
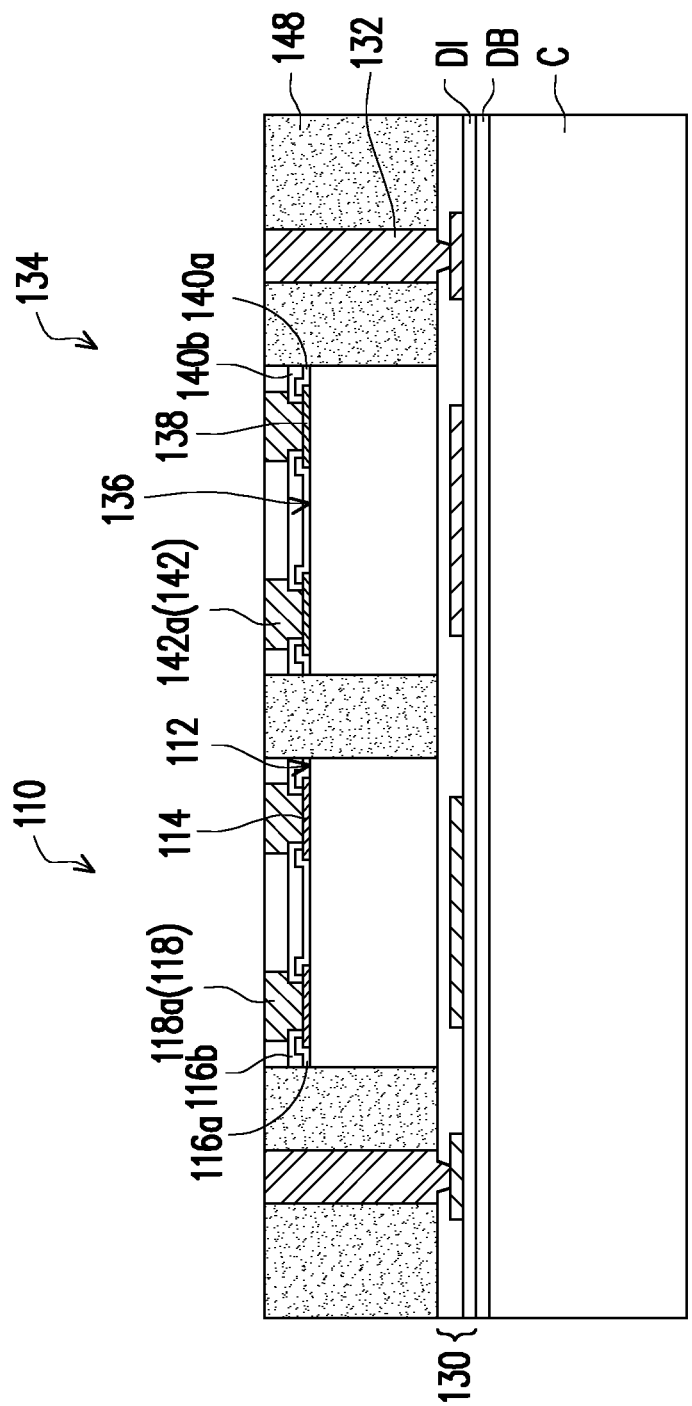

Referring to FIG. 1F, the encapsulating material 146, the dielectric layer 122 of the first die 110 and the dielectric layer 144 of the second die 134 are grinded until the top surfaces of the conductive pillars 118a, 142a and the TIVs 132 are exposed, so as to form an encapsulant 148. In some embodiments, the solder layers 118b, 142b on the conductive pillars 118a, 142a are substantially entirely removed. In some embodiments, since the solder layer 118b is not flowing on the sidewall 120 of the conductive pillar 118a, that is, an amount of the solder residue is significantly reduced (or substantially solder residue-free), the solder layer 118b may be removed easily by the grinding process. Accordingly, the additional removal process for removing the solder residue on the sidewall of the conductive pillar may be omitted. Furthermore, compared with removal of a large portion of the conductive pillar in order to remove the solder residue on the sidewall of the conductive pillar conventionally, in some embodiments, few of the conductive pillar 118a is removed. In some embodiments, after the grinding process, a thickness of the conductive pillar 118a ranges from 13 µm to 23 µm, for example. In some embodiments, the grinding process may be a mechanical grinding, a chemical mechanical polishing (CMP), or another suitable mechanism, for example. In some embodiments, surfaces of the first die 110 and the second die 134, the TIVs 132 and the encapsulant 148 are substantially coplanar.

Figure 1G:
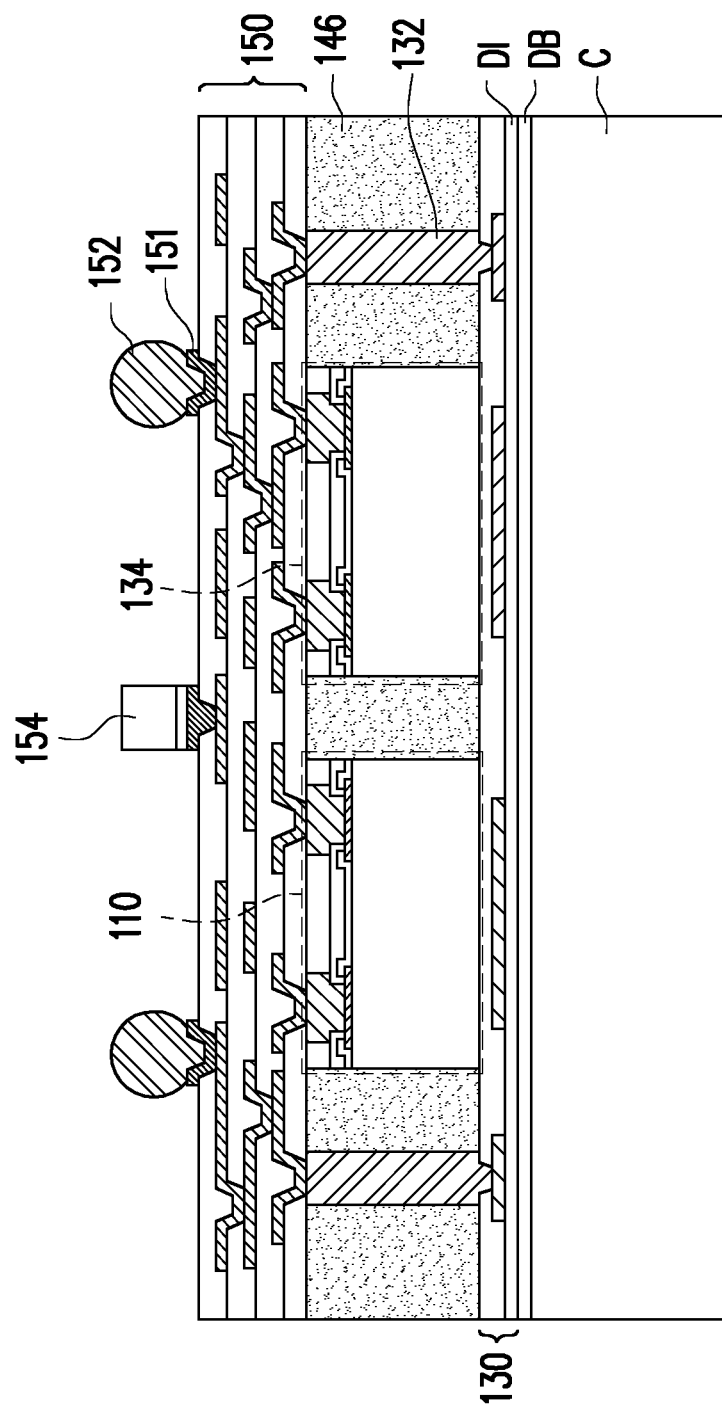

Referring to FIG. 1G, in some embodiments, a redistribution layer 150 is formed on the encapsulant 148, over the conductive pillar 118a of the first die 110, the conductive pillar 142a of the second die 134 and the TIVs 132. In some embodiments, the redistribution layer 150 is electrically connected to the TIVs 132, the conductive pillar 118a of the first die 110 and the conductive pillar 142a of the second die 134. The formation of the redistribution layer 130 includes sequentially forming one or more dielectric material layers and one or more metallization layers in alternation. In some embodiments, a material of the dielectric material layer may be the same as or different from the material of the dielectric layer 122. In other words, in an embodiment, the dielectric material layer may be formed of the dielectric material and the additive. In some embodiments, the redistribution layer 150 is a frontside redistribution layer electrically connected to the first die 110, the second die 134 and the TIVs 132.

In some embodiments, conductive elements 152, 154 are disposed on the redistribution layer 150 and are electrically connected to the redistribution layer 150. In some embodiments, the conductive elements 152 are terminal connectors such as solder balls or ball grid array ("BGA") balls placed on the redistribution layer 150 and the top metallization layer underlying the conductive elements 152 functions as ball pads. In some embodiments, some of the conductive elements 152 are electrically connected to the first die 110 and the second die 134 through the redistribution layer 150, and some of the conductive elements 152 are electrically connected to the TIVs 132. In some embodiments, an under bump metallization (UBM) 151 is disposed under the conductive element 152, for example. In some embodiments, the conductive element 154 may include a surface mount device (SMD) or an integrated passive device (IPD) that include a passive device such as a resistor, an inductor, a capacitor, a jumper, combinations of these, or the like.

Figure 1H:
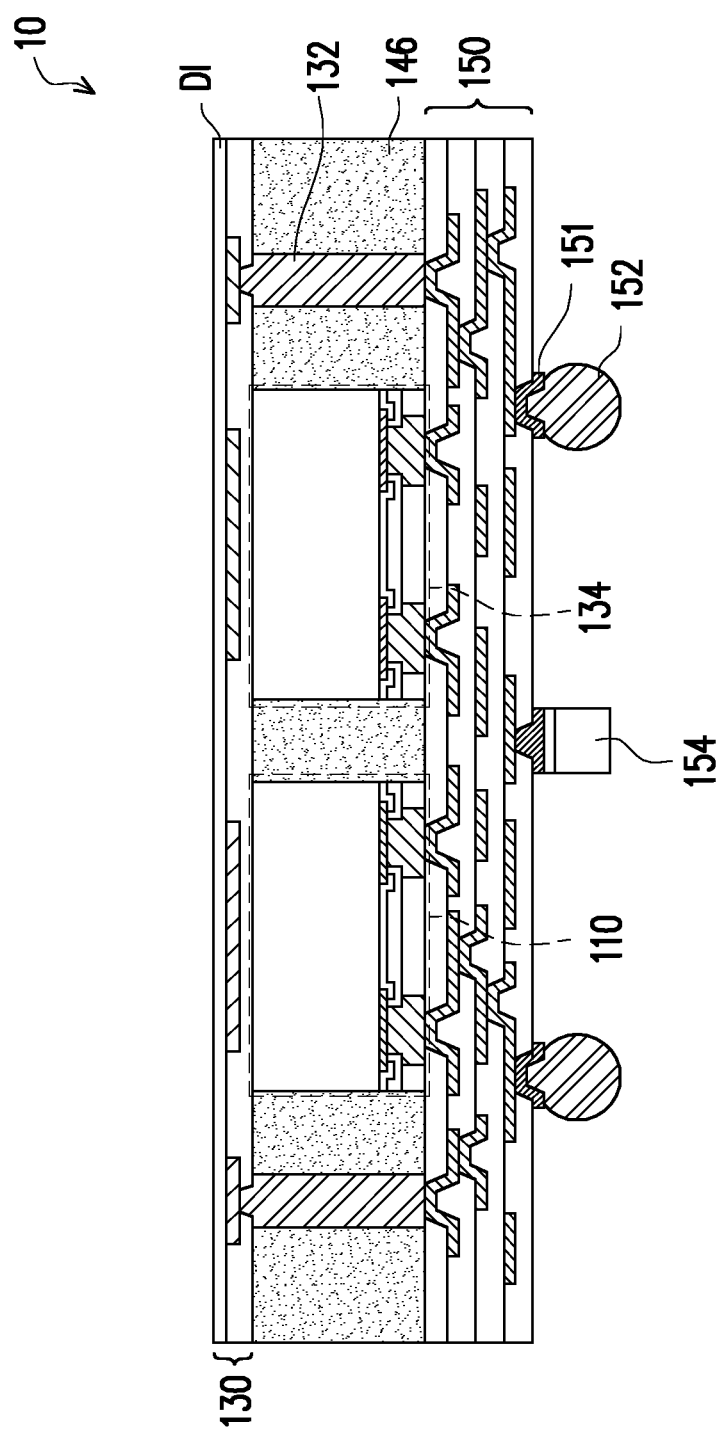

Referring to FIG. 1H, in some embodiments, the whole package is debonded from the carrier C to separate the redistribution layer 130 from the carrier C. In some embodiments, after debonding from the carrier C, the de-bonding layer DB remained on the whole package is removed through an etching process or a cleaning process. In some embodiments, the whole package 10 is turned upside down.

Figure 1I:
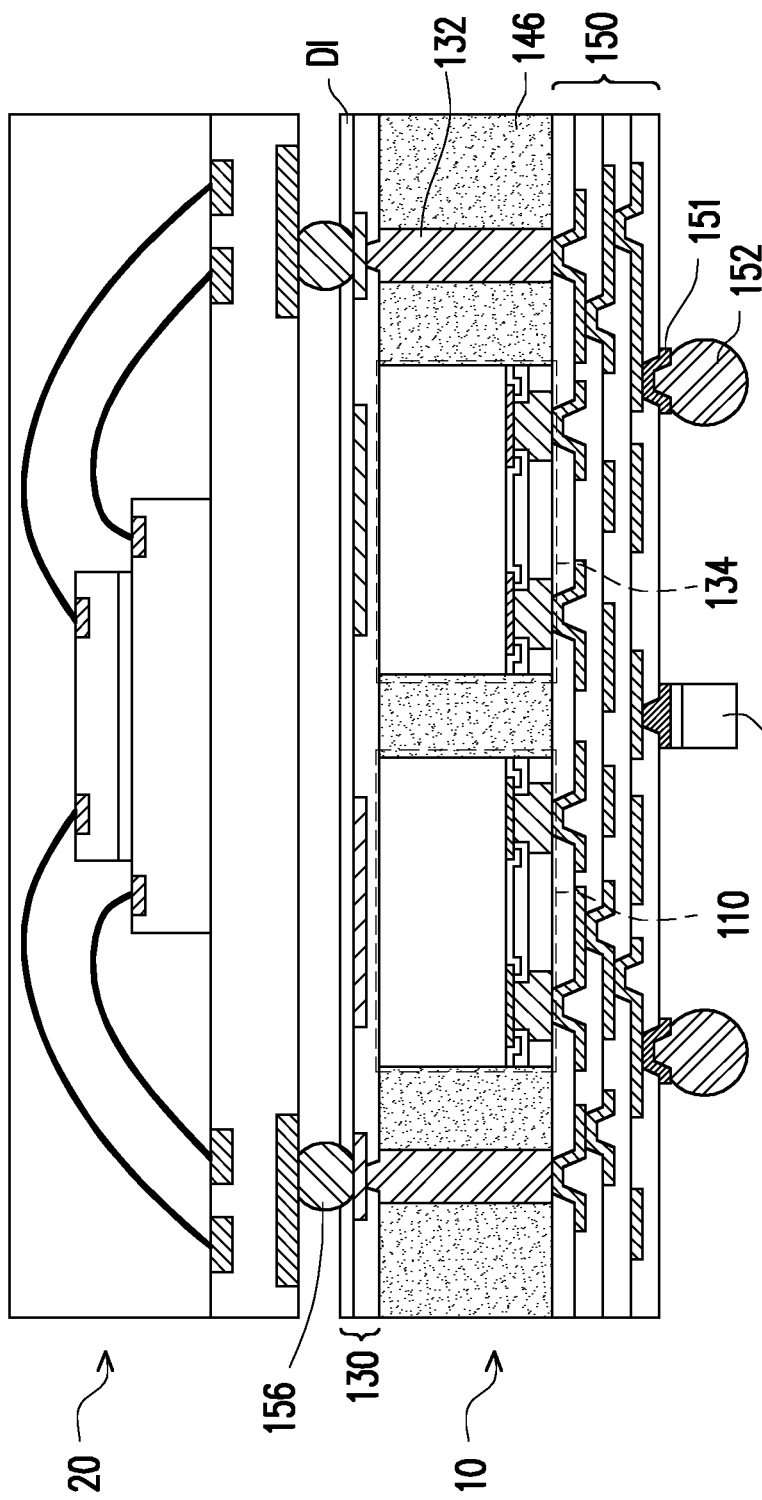

Referring to FIG. 1I, in some embodiments, an electronic device 20 is mounted on and electrically connected to the semiconductor package 10. In some embodiments, the electronic device 20 may be a semiconductor package, and the electronic device 20 is mounted on and electrically connected to the semiconductor package 10 through the conductive elements 156 such as solder balls or BGA balls.

In some embodiments, since the dielectric layer includes the additive, the interface bonding strength between the dielectric layer and the IMC is significantly improved. Therefore, the IMC flowing is inhibited, and the solder residue is prevented to be formed. Accordingly, the delamination or the peeling is avoided, and an impact on the electrical connection due to the solder residue is prevented. Thus, the performance of the package is improved.

According to some embodiments, a semiconductor device includes a dielectric layer and a connector. The dielectric layer includes a dielectric material and an additive, wherein the additive includes a compound represented by Chemical Formula 1. The connector is disposed in the dielectric layer.

According to some embodiments, a semiconductor package includes a first die, a dielectric layer, an encapsulant and a redistribution layer. The first die includes a connector thereon. The dielectric layer is disposed over the first die and aside the connector and includes a dielectric material and an additive, wherein the additive includes a compound represented by Chemical Formula 1. The encapsulant encapsulates the first die and the dielectric layer. The redistribution layer is disposed over the dielectric layer and the connector and electrically connected to the first die through the connector.

According to some embodiments, a method of forming a semiconductor package includes the following steps. A first die having a connector thereon is provided. A dielectric layer is formed on the first die to cover the connector, wherein the dielectric layer comprises a dielectric material and an additive, and the additive includes a compound represented by the following Chemical Formula 1. The first die is bonded onto a first redistribution layer over a carrier. An encapsulant is formed over the first redistribution layer to encapsulate the first die and the dielectric layer. A portion of the encapsulant is removed to expose the connector. A second redistribution layer is formed over the first die to electrically connect to the connector. A terminal connector is formed over the second redistribution layer. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a dielectric layer, comprising a dielectric material and an additive, wherein the additive comprises a compound represented by the following Chemical Formula 1:

[Chemical Formula 1]

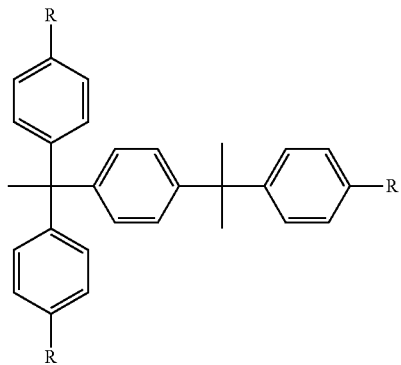

in Chemical Formula 1,

R is hydrogen, a hydroxyl group, a halogen group, a C1-C6 alkyl group, a carboxyl group, a vinyl group, an allyl group, a phenyl group, —OR', —COR", —CONR", —COOR", —CH$_2$—CR"C═CR"$_2$ or —SiR"$_3$, wherein R' is a C1-C6 alkyl group or a group represented by the following Chemical Formula 2 or the following Chemical Formula 3:

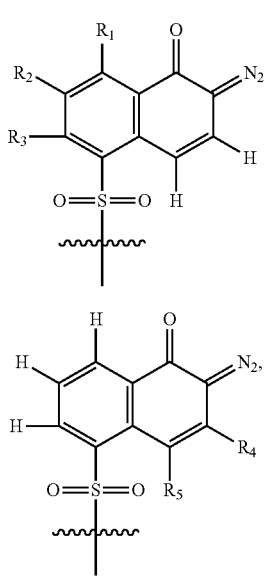

[Chemical Formula 2]

[Chemical Formula 3]

in Chemical Formula 2,

R$_2$ and R$_3$ are hydrogen, and R$_1$ is hydrogen, a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C═CR"$_2$, —SiR"$_3$,

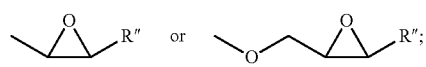

or

R$_1$ and R$_2$ are hydrogen, and R$_3$ is a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C═CR"$_2$ or —SiR"$_3$;

in Chemical Formula 3, one of R$_4$ and R$_5$ is hydrogen, and the other of R$_4$ and R$_5$ is hydrogen, a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C═CR"$_2$ or —SiR"$_3$; and R" is a halogen group, a C1-C6 alkyl group, a vinyl group, an allyl group or a phenyl group; and a connector, disposed in the dielectric layer.

2. The semiconductor device as claimed in claim 1, wherein the dielectric material comprises polyimide, polybenzoxazole or polyacrylate.

3. The semiconductor device as claimed in claim 1, wherein the connector has a conductive pillar and a solder layer on the conductive pillar.

4. The semiconductor device as claimed in claim 3, wherein the conductive pillar has a depression at an edge, and the solder layer is extended into and filled in the depression to cover an upper portion of a sidewall of the conductive pillar.

5. The semiconductor device as claimed in claim 4, wherein an included angle formed between an extended line of a sidewall of the solder layer and an extended line of the portion of the upper portion of the sidewall of the conductive pillar is about 30 degrees to 45 degrees.

6. The semiconductor device as claimed in claim 3, wherein a material of the solder layer includes tin.

7. The semiconductor device as claimed in claim 3, wherein a material of the conductive pillar includes copper.

8. The semiconductor device as claimed in claim 3, wherein a top surface of the solder layer is concave or convex.

9. The semiconductor device as claimed in claim 1, wherein the dielectric layer covers a top of the connector.

10. A semiconductor package, comprising:
a first die, comprising a connector thereon;
a dielectric layer, over the first die and aside the connector, comprising a dielectric material and an additive, wherein the additive comprises a compound represented by the following Chemical Formula 1:

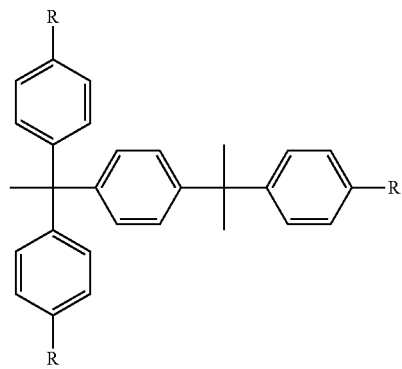

[Chemical Formula 1]

in Chemical Formula 1,

R is hydrogen, a hydroxyl group, a halogen group, a C1-C6 alkyl group, a carboxyl group, a vinyl group, an allyl group, a phenyl group, —OR', —COR", —CONR", —COOR", —CH$_2$—CR"C═CR"$_2$ or —SiR"$_3$, wherein R' is a C1-C6 alkyl group or a group represented by the following Chemical Formula 2 or the following Chemical Formula 3:

15. A method of forming a semiconductor package, comprising:
providing a first die having a connector thereon;
forming a dielectric layer on the first die to cover the connector, wherein the dielectric layer comprises a dielectric material and an additive, and the additive comprises a compound represented by the following Chemical Formula 1:

[Chemical Formula 1]

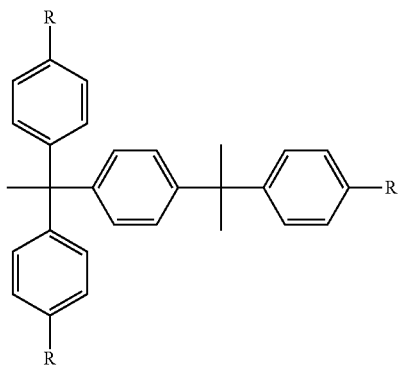

in Chemical Formula 1,
R is hydrogen, a hydroxyl group, a halogen group, a C1-C6 alkyl group, a carboxyl group, a vinyl group, an allyl group, a phenyl group, —OR', —COR", —CONR", —COOR", —CH$_2$—CR"C=CR"$_2$ or —SiR"$_3$, wherein
R' is a C1-C6 alkyl group or a group represented by the following Chemical Formula 2 or the following Chemical Formula 3:

[Chemical Formula 2]

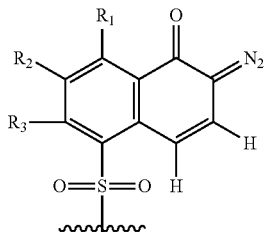

[Chemical Formula 3]

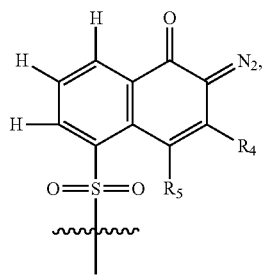

in Chemical Formula 2,
R$_2$ and R$_3$ are hydrogen, and R$_1$ is hydrogen, a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C=CR"$_2$, —SiR"$_3$,

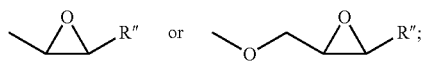

or
R$_1$ and R$_2$ are hydrogen, and R$_3$ is a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C=CR"$_2$ or —SiR"$_3$;
in Chemical Formula 3,
one of R$_4$ and R$_5$ is hydrogen, and the other of R$_4$ and R$_5$ is hydrogen, a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C=CR"$_2$ or —SiR"$_3$; and
R" is a halogen group, a C1-C6 alkyl group, a vinyl group, an allyl group or a phenyl group; and
an encapsulant, encapsulating the first die and the dielectric layer; and
a redistribution layer, over the dielectric layer and the connector and electrically connected to the first die through the connector.

11. The semiconductor device as claimed in claim 10, wherein the dielectric material comprises polyimide, polybenzoxazole or polyacrylate.

12. The semiconductor device as claimed in claim 10, wherein a top of the dielectric layer is substantially planar with a top of the connector.

13. The semiconductor device as claimed in claim 10, wherein the connector is a conductive pillar.

14. The semiconductor device as claimed in claim 10, further comprising a plurality of through integrated fan-out vias aside the first die and encapsulated by the encapsulant.

[Chemical Formula 2]

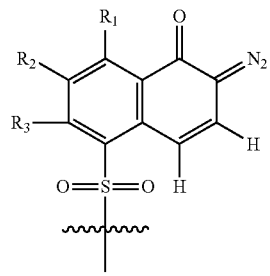

[Chemical Formula 3]

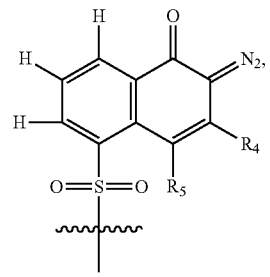

in Chemical Formula 2,
R$_2$ and R$_3$ are hydrogen, and R$_1$ is hydrogen, a hydroxyl group, a halogen group, a C1-C6 alkyl group, a C1-C6 alkoxy group, a carboxyl group, a vinyl group, an allyl group, a phenyl group, —COR", —CONR", —COOR", —CH$_2$—CR"C=CR"$_2$, —SiR"$_3$,

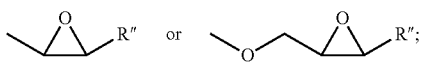

or

R₁ and R₂ are hydrogen, and R₃ is a hydroxyl group, a halogen group, a C1-C6 alkyl group, a C1-C6 alkoxy group, a carboxyl group, a vinyl group, an allyl group, a phenyl group, —COR", —CONR", —COOR", —CH₂—CR"C═CR"₂ or —SiR"₃;

in Chemical Formula 3, one of R₄ and R₅ is hydrogen, and the other of R₄ and R₅ is hydrogen, a hydroxyl group, a halogen group, a C1-C6 alkyl group, a C1-C6 alkoxy group, a carboxyl group, a vinyl group, an allyl group, a phenyl group, —COR", —CONR", —COOR", —CH₂—CR"C═CR"₂ or —SiR"₃; and R" is a halogen group, a C1-C6 alkyl group, a vinyl group, an allyl group or a phenyl group;

bonding the first die onto a first redistribution layer over a carrier;

forming an encapsulant over the first redistribution layer to encapsulate the first die and the dielectric layer;

removing a portion of the encapsulant to expose the connector;

forming a second redistribution layer over the first die to electrically connect to the connector;

forming a terminal connector over the second redistribution layer; and removing the carrier.

16. The method as claimed in claim 15, wherein the amount of the additive is less than 10 parts based on 100 parts by weight of the dielectric material.

17. The method as claimed in claim 15, wherein the dielectric material comprises polyimide, polybenzoxazole or polyacrylate.

18. The method as claimed in claim 15, wherein after forming the dielectric layer, a portion of the solder layer is flowing down to a sidewall of the conductive pillar and stops on a top of the dielectric layer on the sidewall of the conductive pillar.

19. The method as claimed in claim 15, wherein the connector has a conductive pillar and a solder layer on the conductive pillar, and the solder layer is removed while removing the portion of the encapsulant.

20. The method as claimed in claim 15, wherein the dielectric layer is formed at a temperature of between about 170° C. and 320° C.

* * * * *